US006686630B2

(12) United States Patent
Hanafi et al.

(10) Patent No.: US 6,686,630 B2
(45) Date of Patent: Feb. 3, 2004

(54) DAMASCENE DOUBLE-GATE MOSFET STRUCTURE AND ITS FABRICATION METHOD

(75) Inventors: Hussein Ibrahim Hanafi, Basking Ridge, NJ (US); Erin C. Jones, Tuckahoe, NY (US); Cheruvu Suryanarayana Murthy, Hopewell Junction, NY (US); Philip Joseph Oldiges, LaGrangeville, NY (US); Leathen Shi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/778,335

(22) Filed: Feb. 7, 2001

(65) Prior Publication Data

US 2002/0105039 A1 Aug. 8, 2002

(51) Int. Cl.[7] .......... H01L 29/76; H01L 29/94; H01L 31/062; H01L 31/113; H01L 31/119; H01L 31/0392; H01L 21/336; H01L 21/00; H01L 21/84

(52) U.S. Cl. .......... 257/366; 257/347; 257/350; 438/283; 438/157

(58) Field of Search .......... 257/347, 350, 257/366, 401, 283, 157; 438/157, 283

(56) References Cited

U.S. PATENT DOCUMENTS

| 4,601,779 A | * | 7/1986 | Abernathey et al. | 204/192.25 |
|---|---|---|---|---|
| 5,273,921 A | * | 12/1993 | Neudeck et al. | 438/157 |
| 5,296,727 A | * | 3/1994 | Kawai et al. | 257/347 |
| 5,461,250 A | * | 10/1995 | Burghartz et al. | 257/192 |
| 5,497,019 A | * | 3/1996 | Mayer et al. | 257/327 |
| 5,604,368 A | * | 2/1997 | Taur et al. | 257/348 |
| 5,681,775 A | * | 10/1997 | Pogge | 148/DIG. 12 |
| 5,929,479 A | * | 7/1999 | Oyama | 257/192 |
| 6,248,637 B1 | * | 6/2001 | Yu | 438/300 |

OTHER PUBLICATIONS

Wong et al. self-aligned (top and bottom) double-gated mosfet with 25 nm thick silicon channel, IEEE 1997 pp. 16.6.1–16.64.*

Yan, R., et al., "Scaling the Si MOSFET: From Bulk to SOI to Bulk", IEEE Transactions of Electronic Devices, vol. 39, No. 7, pp. 1704–1710, (Jul., 1992).

Wong, P., et al., "Self–Aligned (Top and Bottom) Double– Gate MOSFET with a 25 nm Thick Silicon Channel", IEEE Transactions of Electron Devices, pp. 427–430, (Jul., 1997).

* cited by examiner

Primary Examiner—Tom Thomas
Assistant Examiner—Samuel A Gebremariam
(74) Attorney, Agent, or Firm—Scully, Scott, Murphy & Presser; Wan Yee Cheung (57) ABSTRACT

The present invention provides a method for fabricating sub-0.05 μm double-gated MOSFET devices utilizing a damascene-gate process. The damascene-gate process provides sub-0.05 μm double-gated MOSFET devices which include a frontside poly gate electrode and a backside implant region. The two gates are separated by two gate dielectrics that include a thin (on the order of about 200 Å or less) Si layer which is sandwiched between the gate dielectrics. The Si layer serves as the channel region of the device. Short-channel effects are greatly suppressed in the present double-gate MOSFET device because the two gates terminate the drain filed lines, preventing the drain potential from being felt at the source end of the channel.

4 Claims, 7 Drawing Sheets

DAMASCENE DOUBLE-GATE MOSFET STRUCTURE AND ITS FABRICATION METHOD

FIELD OF THE INVENTION

The present invention relates to a double-gated metal oxide semiconductor field effect transistor (MOSFET), and more particularly to a sub-0.05 μm double-gated MOSFET which has excellent short-channel characteristics. The inventive double-gated MOSFET includes a frontside gate electrode comprised of polysilicon and a backside gate electrode that is comprised of an implant region, the two gates are separated by two gate dielectrics and a thin layer of silicon (on the order of about 200 Å or less) which is sandwiched between the two gate dielectrics. The thin layer of Si serves as the device channel region of the inventive structure. The present invention also relates to a method of fabricating a sub-0.05 μm double-gated MOSFET which employs a dummy gate and a damascene process.

BACKGROUND OF THE INVENTION

Over the past twenty-five years or so, the primary challenge of VLSI has been the integration of an ever-increasing number of MOSFET devices with high yield and reliability. This was achieved mainly by scaling down MOSFET channel lengths without excessive short-channel effects. Short-channel effects, as is well known to those skilled in the art, are the decrease in threshold voltage, $V_t$, in short-channel devices due to two-dimensional electrostatic charge sharing between the gate and the source/drain regions.

To scale down MOSFET channel lengths without excessive short-channel effects, gate oxide thickness has to be reduced while increasing channel-doping concentration. However, Yan, et al., "Scaling the Si MOSFET: From Bulk to SOI to Bulk", IEEE Trans. Elec. Dev., Vol. 39, p. 1074, July 1992 have shown that to reduce short-channel effects in sub-0.05 μm MOSFETs, it is important to have a backside conducting layer to screen the drain field away from the channel. The results published in Yan, et al. show that double-gated MOSFETs and MOSFETs with a top gate and a backside ground plane are more immune to short-channel effects and hence can be scaled to shorter dimensions than conventional MOSFETs.

The main problem associated with the double-gated MOSFET described in Yan. et al. is that the gates have to be fabricated self-aligned to each other and to the source and drain regions. This provides a device with excellent short-channel characteristics, low device capacitance and improved performance. Although Yan, et al. describes the possibility of forming sub-0.05 μm double-gated MOSFET devices, this prior art reference does not disclose a viable and easily manufacturable (which follows conventional CMOS process) means for achieving the same.

In view of the drawbacks associated with prior art double-gated MOSFET technologies, there is a continued need to develop new and improved methods that will permit the successful formation of sub-0.05 μm double-gated MOSFETs, without the need of completely relying on lithography to define the gate regions of the device.

SUMMARY OF THE INVENTION

One object of the present invention is to provide a method of fabricating a sub-0.05 μm double-gated MOSFET device with the front and back gates self-aligned to each other and to the source and drain regions.

Another object of the present invention is to provide a method of fabricating a sub-0.05 μm double-gated MOSFET device which has excellent short-channel characteristics.

A further object of the present invention is to provide a method of fabricating a sub-0.05 μm double-gated MOSFET device which includes simple, yet CMOS compatible processing steps.

An even further object of the present invention is to provide a method of fabricating a sub-0.05 μm double-gated MOSFET device which includes a raised source/drain region formed abutting the gate region of the double-gated MOSFET device.

These and other objects and advantages can be achieved by utilizing a method which includes a dummy gate region which is used to define the area for an implanted backside (i.e., bottom) gate electrode as well as defining the channel length of the device and a damascene processing step which is used in forming the frontside (i.e., top) gate electrode of the device. These two gates are separated by two gate dielectrics and a thin (less than about 200 Å) Si layer which is sandwiched between the two gate dielectrics. This thin layer of Si serves as the channel region of the device. Short-channel effects are greatly suppressed in the present invention because the two gates terminate the drain field lines, preventing the drain potential from being felt at the source end of the channel.

In accordance with the present invention, a double-gated MOSFET device is fabricated utilizing the following processing steps:

(a) providing a structure which includes a top wafer bonded to a bottom wafer through a dielectric layer, said top wafer comprising a silicon-on-insulator wafer which includes a buried oxide layer sandwiched between a semiconductor substrate and a semiconducting material layer, wherein said semiconductor material layer is thinner than said semiconductor substrate and is contact with a surface of said dielectric layer, and said bottom wafer comprises a P⁻ epi layer formed on a P⁺ layer;

(b) removing said semiconductor substrate and said buried oxide layer stopping on said semiconducting material layer;

(c) forming a pad oxide layer on said semiconducting material layer;

(d) forming a dummy gate region on a portion of said pad oxide layer, said dummy gate region including a sacrificial region of polysilicon having spacers formed on exposed sidewalls thereof;

(e) forming an oxide layer on other portions of said pad oxide layer that do not contain said dummy gate region, said oxide layer is substantially planar with a top surface of said sacrificial region of polysilicon;

(f) removing said sacrificial region of polysilicon stopping on said pad oxide layer so as to providing an opening;

(g) forming a channel implant region in said semiconducting material layer by implanting though said opening;

(h) forming a backside gate implant region in at least said P⁻ epi layer;

(i) removing said pad oxide in said opening and forming a gate dielectric in place thereof;

(j) forming a polysilicon frontside gate region on said gate dielectric in said opening, said polysilicon frontside gate region is substantially planar with said oxide layer; and (l) removing said oxide layer and said pad oxide layer abutting the spacers.

The dielectric material used in step (a) of the present invention serves as the gate dielectric of the backside gate electrode as well as a diffusion barrier layer.

Following step (l) of the first embodiment of the present invention, it is possible to form raised source/drain regions and/or to carry out conventional back-end-of-the-line (BEOL) processing steps. The raised source/drain regions are formed on the exposed semiconducting material layer that is adjacent to the double-gated MOSFET region.

It is noted that processing steps (a)–(l) mentioned above work well in cases wherein the semiconducting material layer of the SOI wafer has a thickness of about 200 Å or less. Alternatively, it is possible to utilize a thicker semiconducting material layer, e.g., about 600 Å. When a thicker semiconducting material layer is employed, the inventive method would include repeated oxidation and chemical oxide removal (COR) processes which would be carried out between steps (f) and (g) above, or alternatively between steps (h) and (i) above. The repeated oxidation and COR processing steps are able to thin the semiconducting material layer to ranges that are more desirable for double-gated MOSFET devices.

Another aspect of the present invention relates to a sub-0.05 μm double-gated MOSFET device which has excellent short-channel characteristics. Specifically, the inventive sub-0.05 μm double-gated MOSFET device comprises:

- a substrate which includes a source region and a drain region abutting a sub-0.05 μm channel region, said channel region being formed in a semiconducting material layer having a thickness of less than about 200 Å and being sandwiched between two gate dielectrics;
- an implanted backside gate electrode formed beneath said channel region; and
- a polysilicon frontside gate electrode formed over said channel region.

The inventive sub-0.05 μm double-gated MOSFET device may also include raised source/drain regions.

DETAILED DESCRIPTION OF THE INVENTION

The present invention, which provides a sub-0.05 μm double-gated MOSFET device which has excellent short-channel characteristics and method of fabricating the same, will now be described in grater detail by referring to the drawings that accompany the present invention. It is noted that in the accompanying drawings like and/or corresponding elements are referred to by like reference numerals.

Figure 1:
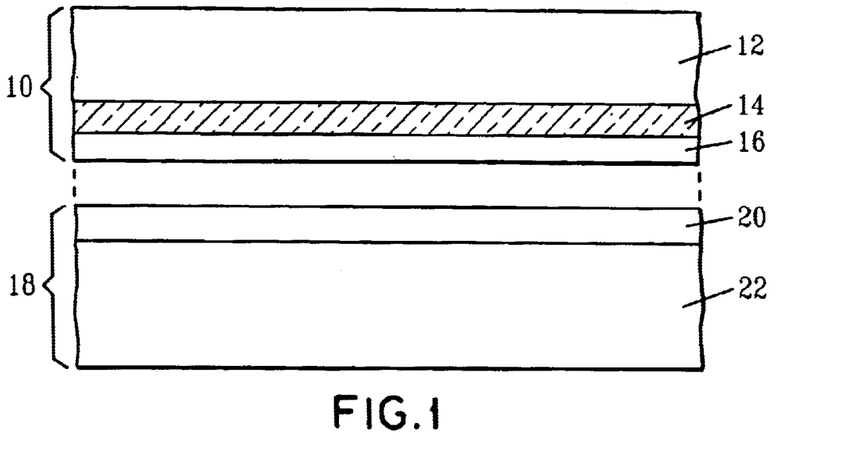
FIGS. 1–10 show the basic processing steps of the present invention wherein a semiconducting material layer of an SOI substrate having a thickness of about 200 Å or less is employed.

Reference is first made to FIG. 1 which illustrates two wafers that are employed in the present invention prior to bonding the two wafers together. Specifically, FIG. 1 shows a top wafer 10 and a bottom wafer 18. Top wafer 10 is a conventional SOI (silicon-on-insulator) wafer that is formed utilizing conventional bonding processes or a conventional SIMOX process (separation by ion implantation with oxygen). SOI wafer 10 includes buried oxide layer 14 that is sandwiched between semiconductor substrate 12 and semiconducting material layer 16. It is noted that the semiconducting material layer is thinner than the semiconductor substrate, and that the buried oxide layer serves as an insulating layer between these two layers of the SOI wafer.

The thicknesses of the various layers of SOI wafer 10 are within limits that are well known to those skilled in the art. For example, the thickness of the buried oxide region is typically in the range of from about 1000 to about 2000 Å, with a thickness of about 1500 Å being more preferred. In the case of the semiconducting material layer, the semiconducting material layer may, in this embodiment of the present invention, have a thickness of from about 200 Å or less, with a range of from about 70 to about 180 Å being more preferred. In the second embodiment of the present invention, which will be described in more detail hereinbelow, the semiconducting material layer has a thickness of about 300 Å or greater, with a range of from about 400 to about 700 Å being more preferred. The thickness of the semiconductor substrate of the SOI wafer is not critical to the present invention so long as it is thicker than the semiconducting material layer. The semiconductor substrate of the SOI wafer may be composed of a conventional semiconducting material such as Si, Ge, SiGe, InAs, GaAs, InP and other like III/V compound semiconductors. In a preferred embodiment of the present invention, semiconductor substrate 12 of SOI wafer 10 is composed of Si.

The semiconducting material layer of the SOI wafer typically has a dopant concentration on the order of from about 1E14 to about 5E15 atoms/cm$^3$, with a dopant concentration of about 2E15 atoms/cm$^3$ being more preferred. It is noted that the semiconducting material layer is the layer of the SOI wafer in which the active devices are typically built.

Insofar as bottom wafer 18 is concerned, that wafer includes P$^-$ epi layer 20 formed on P$^+$ layer 22. The epi layer is formed by epitaxially growing a doped silicon layer on the previously P$^+$ doped layer. In accordance with the present invention, the P$^-$ epi layer is lightly doped as compared to the P$^+$ layer which is more heavily doped. Typically, the P$^-$ epi layer has a dopant concentration of from about 1E14 to about 5E15 atoms/cm$^3$, with a dopant concentration of about 2E15 atoms/cm$^3$ being more preferred. Insofar as the P$^+$ layer is concerned, that layer has a dopant concentration of from about 1E19 to about 7E19 atoms/cm$^3$, with a dopant concentration of about 5E19 atoms/cm$^3$.

Figure 2:
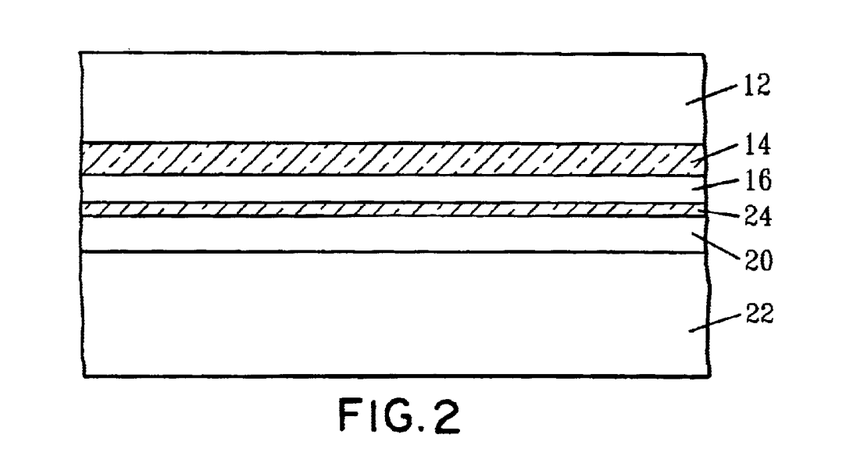

FIG. 2 shows the structure that is obtained after the top wafer is bonded to the bottom wafer. Note that the semiconducting material layer of the top SOI wafer is bonded to the P$^-$ epi layer of the bottom wafer and that prior to bonding dielectric layer 24 is formed on the surface of the P$^-$ epi layer, the semiconducting material layer or both the aforesaid layers utilizing thermal growing techniques that are well known to those skilled in the art. For example, the dielectric layer may be formed a thermal oxidation or oxynitridation process. The thickness of the dielectric layer may vary, but typically, the dielectric layer employed in the present invention has a thickness of from about 20 to about 50 Å, with a thickness of from about 30 to about 40 Å being more preferred. Dielectric layer 24 serves two important functions in the present invention. First, dielectric layer 24 is the backside gate dielectric material; and secondly, dielectric layer 24 provides a diffusion barrier layer in the structure.

The backgate dielectric layer, i.e., layer 24, of the present invention includes any material that is capable of minimizing the diffusion of boron into the top wafer. Illustrative examples of some types of materials that can be used as this layer include, but are not limited to: oxides, oxynitrides and multilayers thereof.

The two wafers shown in FIG. 2 are bonded together by utilizing conventional bonding techniques that are well known to those skilled in the art. For example, the two wafers may be bonded by positioning the top wafer on the bottom wafer, as shown, in FIG. 1, and thereafter heating the wafers to a temperature of from about 900° to about 1050° C. for a time period of from about 1.5 to about 2.5 hours. In one preferred embodiment of the present invention, the wafers are bonded together at a temperature of about 1050° C. for a time period of about 2 hours. It is noted that during the bonding process, some diffusion of dopants in the P⁻ epi layer may occur therefore, this layer becomes slightly thinner after the bonding process.

Figure 3:
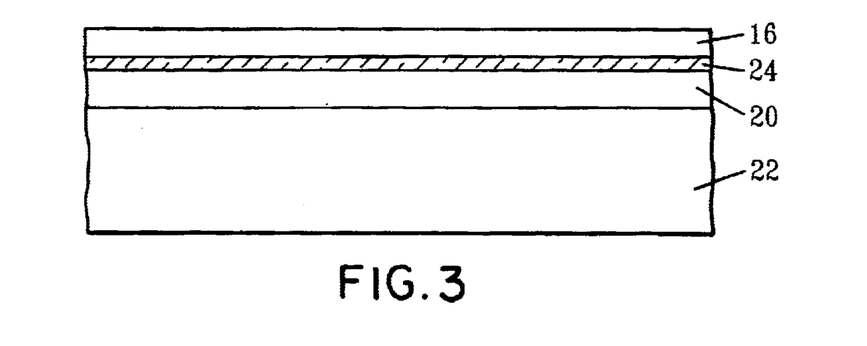

Following the bonding of the two wafers, semiconductor substrate 12 and buried oxide layer 14 of the bonded substrate are removed, stopping on the semiconducting material layer, See FIG. 3. The removal of the substrate of the SOI wafer and the buried oxide layer of the SOI wafer is achieved utilizing conventional processes that are well known to those skilled in the art. For example, the semiconductor substrate and buried oxide layer may be removed utilizing a single polishing step such as chemical-mechanical polishing (CMP) or grinding, or alternatively, the various layers are removed utilizing separate, and distinct removal processes. The use of separate, and distinct removal processes is preferred herein since it provides for more selectively and ensures that the removal process stops on the semiconducting material layer.

When separate, and distinct removal processes are employed, the semiconductor substrate is first removed, stopping on the buried oxide layer, by utilizing a conventional CMP process which was a high-selectivity for removing a semiconductor material as compared with oxide. Next, an oxidation process may be performed to ensure that only oxide remains on the surface of the bonded substrate and a conventional chemical etching process that has a high-selectivity for removing oxide as compared to semiconductor is employed. For example, an HF etching process can be employed in the present invention for removing the buried oxide layer of the bonded structure. Note that the various removal processes expose the semiconducting material layer of the bonded structure.

Figure 4:
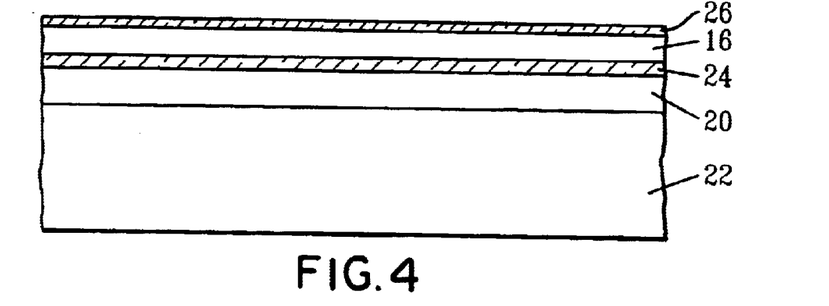

FIG. 4 shows the structure that is obtained after pad oxide layer 26 is formed on the now exposed semiconducting material layer. Pad oxide layer 26 may be formed by utilizing a conventional thermal growing process, or alternatively, the pad oxide layer may be formed by a conventional deposition process such as, but not limited to: CVD, plasma-assisted CVD, sputtering, evaporation, chemical solution deposition and other like deposition processes. The thickness of the pad oxide layer employed in the present invention may vary, but typically it should be thicker than the gate dielectric (i.e., gate insulator) which will be subsequently formed in the present invention. Typically, the pad oxide layer has a thickness of from about 40 to about 100 Å.

Next, isolation trench regions (not shown in the drawings) are formed in the bonded structure utilizing techniques that are well known to those skilled in the art. The isolation trenches are formed through the previously formed pad oxide layer and a portion of the bonded structure. Isolation trenches are formed using conventional lithography and etching (such as reactive-ion etching (RIE), plasma etching, ion beam etching and other like dry etching processes). Although not shown in the drawings, the lithography step may employ a conventional photoresist and optionally an anti-reflective coating, both of which are removed after the isolation trenches have been formed in the bonded substrate.

An oxide liner, e.g. $SiO_2$, is formed in the isolation trenches so as to line sidewalls and the bottom of each trench and thereafter the trench is filled with a trench dielectric material such as tetraethylorthosilicate (TEOS). An optional densification step and/or planarization step may follow the trench fill. The trench fill is conducted utilizing conventional deposition processes well known to those skilled in the art such as CVD. It is again emphasized that the isolation regions are not shown in the drawings of the present invention, but they are typically present in regions abutting the regions depicted in the drawings.

Figure 5:
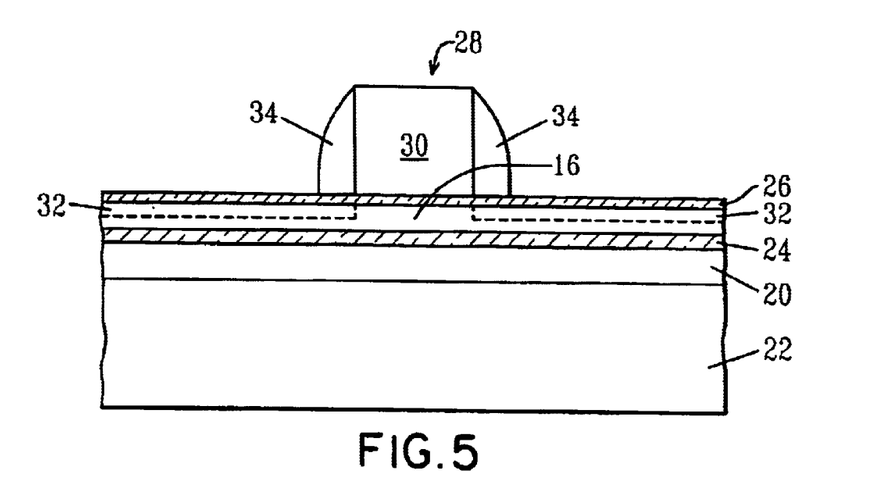

Next, as depicted in FIG. 5, dummy gate region 28 is formed on pad oxide layer 26. Specifically, the dummy gate region is first formed by depositing a sacrificial layer of polysilicon on all exposed surfaces of the pad oxide. The sacrificial polysilicon layer is then patterned by conventional lithography and etching so as to form sacrificial polysilicon gate region 30 in the structure. Following formation of the patterned sacrificial polysilicon gate region, source and drain extension regions 32 are formed in the structure utilizing a conventional ion implantation process well known to those skilled in the art. As shown, the extension regions are implanted into the semiconducting material layer of the bonded wafers. Following the formation of the source/drain extension regions, spacers 34 are formed on exposed sidewalls of patterned sacrificial polysilicon gate region 30. The spacers which may be composed of a conventional nitride or oxynitride material are formed by deposition and etching.

Figure 6:
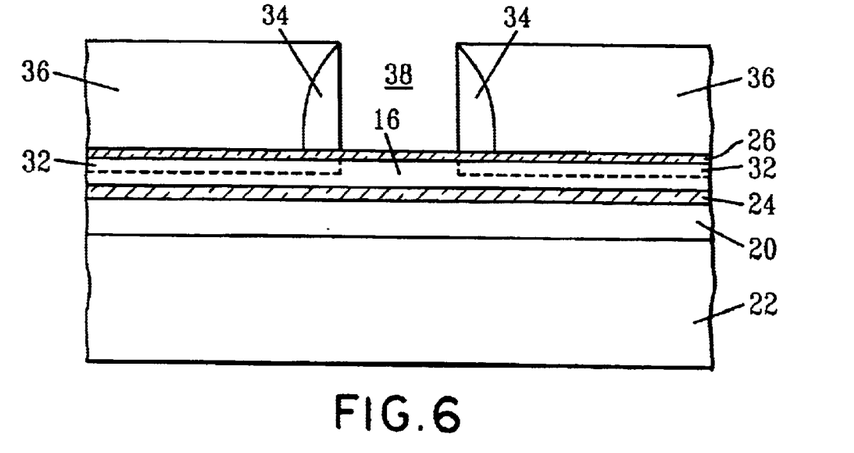

Reference is now made to FIG. 6 which shows the structure of the present invention after formation of planarized oxide layer 36 and removal of sacrificial polysilicon gate region 30. The planarized oxide layer is formed by first depositing an oxide such as TEOS on all exposed surfaces of the structure including over the sacrificial polysilicon gate region as well as the pad oxide layer, and thereafter planarizing the oxide layer. Oxide is deposited utilizing a conventional deposition process such as CVD and a chemical down stream etching (CDE) process is used in removing the sacrificial polysilicon gate region. The CDE process employed in the present invention includes any etching process that has a high-selectivity for removing polysilicon as compared to oxide. As shown, in FIG. 6, opening 38 is formed in the structure in the area previously occupied by the sacrificial polysilicon gate region stopping on pad oxide layer 26.

Figure 7:
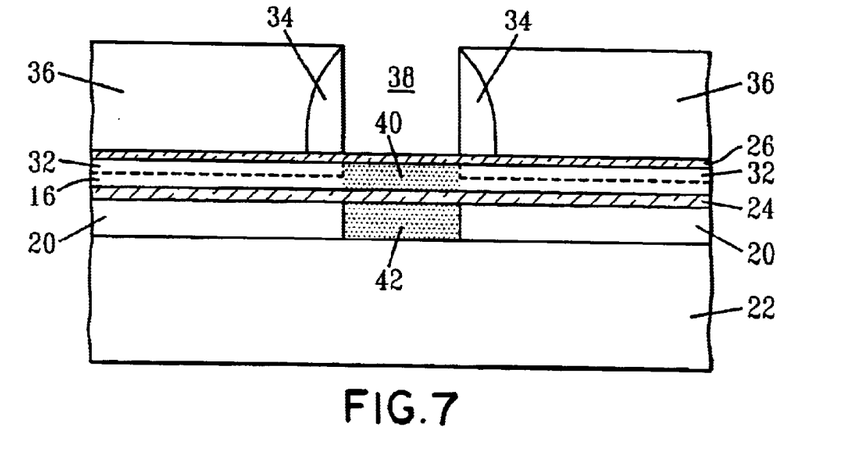

Next, as shown in FIG. 7, implants are conducted through opening 38 so as to form device channel region 40 and backside implant region 42 in the structure. The device channel is formed by ion implantation utilizing an ion dose and energy that is sufficient to doped the semiconducting material layer that is below the pad oxide in the opening. Typically, in the present invention, an implant energy of from about 10 to about 50 keV is employed in doping the semiconducting material layer during this step of the present invention. The implant dose employed during this implant is from about 5E14 to about 1E15 atoms/cm². Following doping of portions of the semiconducting material layer, P⁻ epi layer 20 beneath the opening is subjected to an ion implantation step utilizing implant energies that are capable of forming backside implant region 42, yet are sufficient to prevent amorphization of the previous doped channel region. Typically, in the present invention, the implantation of the P⁻ epi layer occurs at an implant energy of from about 150 to about 250 keV and the implant dose is on the order of from about 5E14 to about 1E15 atoms/cm². It is noted that backside implant region 42 serves as the backside gate electrode of the inventive double-gated MOSFET device.

Following doping of these two regions, both implants are subjected to a conventional annealing process which is typically conducted in an inert gas such as helium, nitrogen, or argon. Although various annealing temperatures and times may be employed in the present invention in activating the previous implanted regions, it is preferred to anneal at a temperature of about 1000° C. for about 5 seconds.

Following implantation and annealing of the channel region and the backside implant region, pad oxide layer 26 in the opening is removed utilizing a conventional etching process well known to those skilled in the art, and gate dielectric 44 having the same or different thickness of the previous pad oxide layer is formed over the channel region. In accordance with the present invention, it is preferred that the gate dielectric be formed by a thermal growing process and that the gate dielectric be composed of an oxide such as SiO₂.

Figure 8:
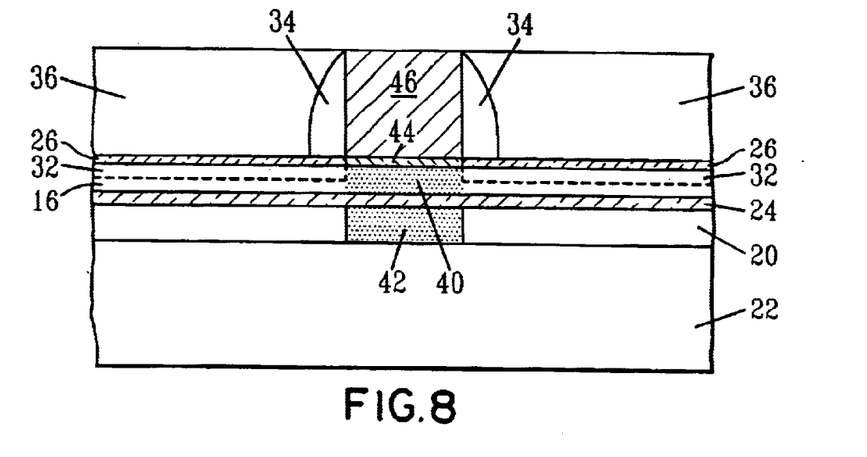

Next, polysilicon gate region 46 (which serves as the frontside gate electrode of the device) is formed on gate dielectric 44 utilizing a conventional deposition process well known to those skilled in the art and the structure is subjected to a conventional planarization process such as CMP so as to form the structure illustrated in FIG. 8. In the present invention, the polysilicon gate region is a doped polysilicon region that may be formed utilizing a conventional in-situ doping deposition process, or in another embodiment, the polysilicon gate region is formed by deposition of intrinsic polySi followed by ion implantation.

Figure 9:
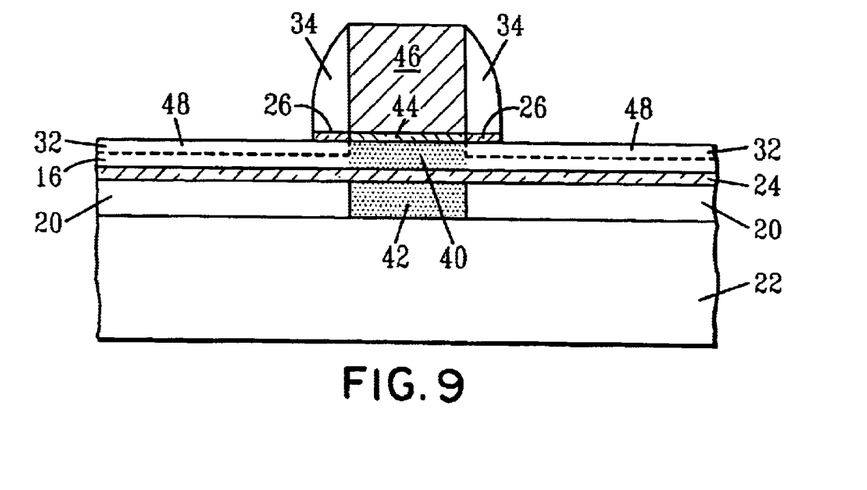

Next, as shown in FIG. 9, the oxide abutting the polysilicon gate region is removed from the structure utilizing a conventional etching process that is highly selective in removing oxide as compared to polysilicon or spacer material. Note that during this etching step of the present invention any pad oxide layer beneath oxide layer 36 may also be removed stopping on semiconducting material layer 16. The semiconducting material layer exposed includes source/drain regions 48 of the device.

Figure 10:
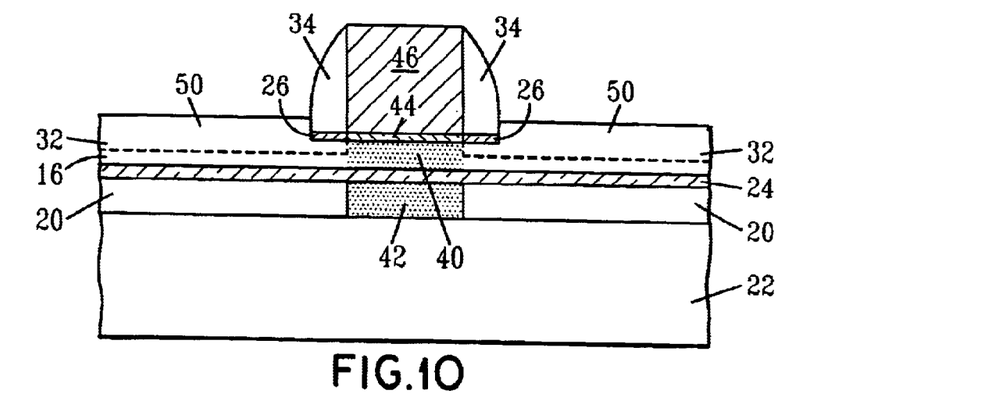
Figure 11:
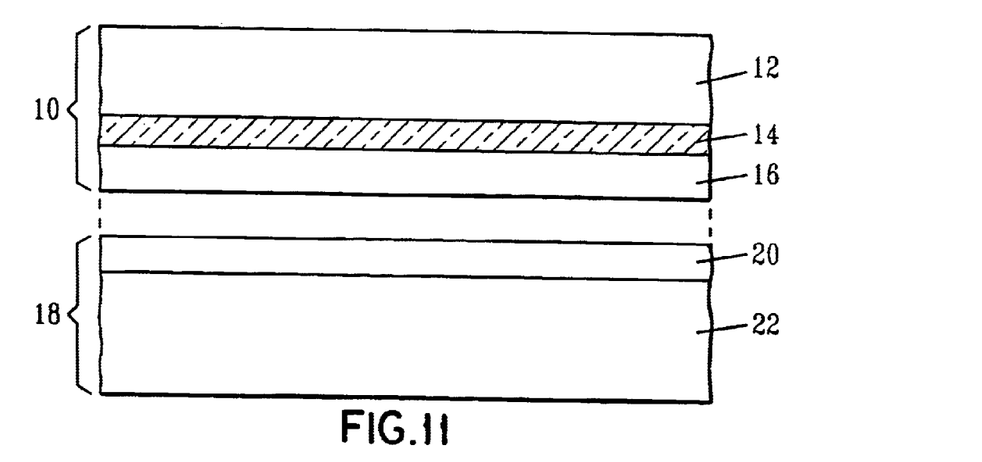
FIGS. 11–20 show the basic processing steps of an alternative embodiment of the present invention wherein a semiconducting material layer of a SOI wafer having a thickness of about 600 Å is employed and is thinned during a COR etching process.
Figure 12:
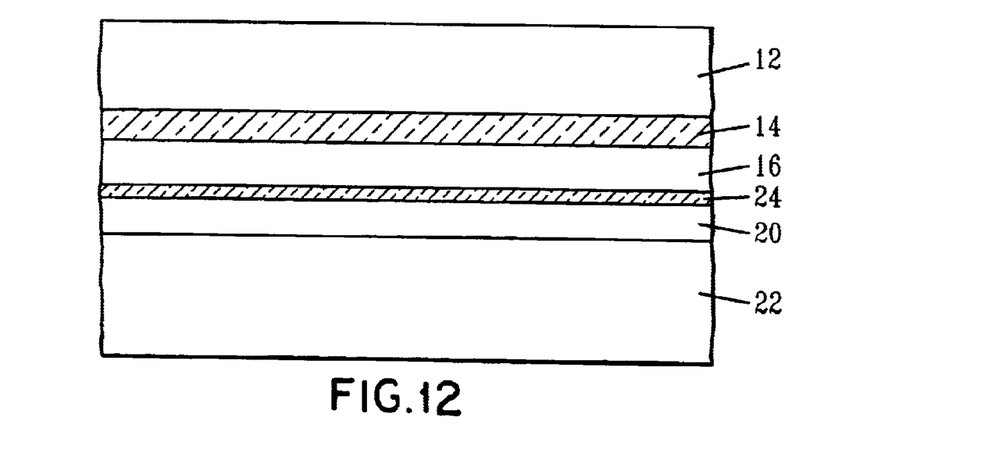
Figure 13:
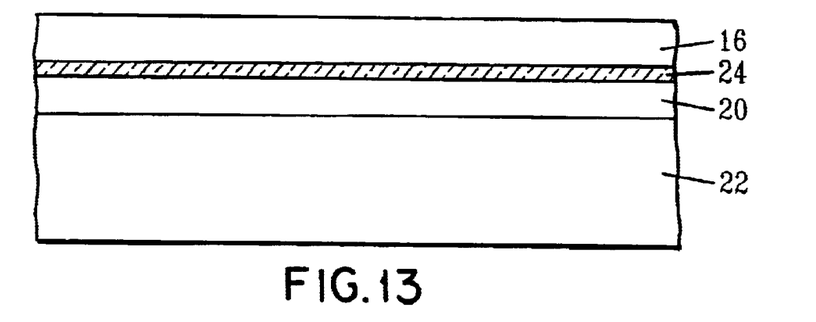
Figure 14:
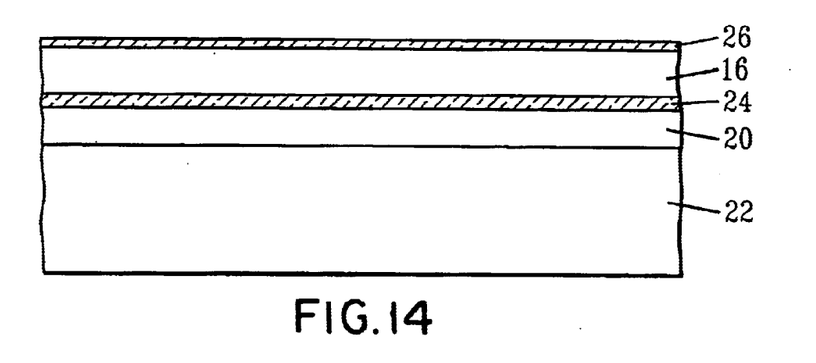
Figure 15:
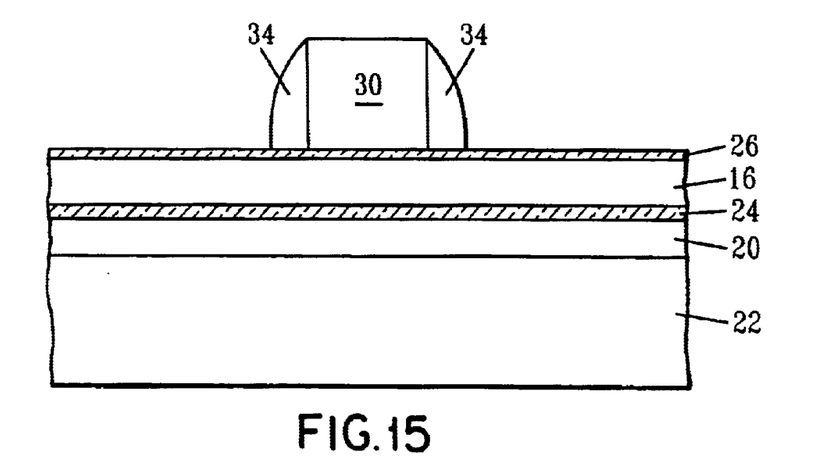
Figure 16:
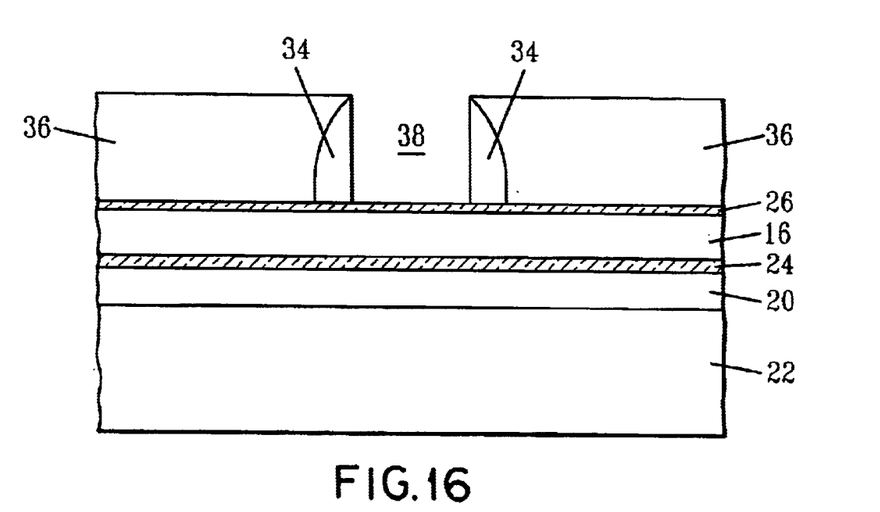

Following the above steps, raised source/drain regions 50, as depicted in FIG. 10, may be formed utilizing conventional processes well known to those skilled in the art: Including deposition of a layer of epi polysilicon or Si and doping the thus deposited epi polysilicon or Si layer by ion implantation and annealing. To either the structure shown in FIG. 9 or FIG. 10, conventional BEOL process steps may be performed so as to contact this inventive structure to external devices and/or other devices that may be present in the structure.

It is again emphasized that the above description and FIGS. 1–10 relate to an embodiment of the present invention wherein the semiconducting material layer of the SOI wafer is a thin (about 200 Å or less) layer. In addition to thin semiconducting material layers, the present invention also contemplates the use of thick semiconducting material layers (greater than about 300 Å) This embodiment of the present invention will now be described in greater detail by referring to the description that appears hereinbelow as well as FIGS. 11–20.

Specifically, in this embodiment of the present invention, the processing steps used in forming the structure shown in FIG. 6 are first performed except that semiconducting material layer 16 of the SOI wafer is thicker than the embodiment described above. Note that FIGS. 11–16 are nearly identical to FIGS. 1–6 except that semiconducting material layer 16 is thicker in these figures than in the previous figures.

At this point of the second embodiment of the present invention, repeated oxidation and chemical oxide removal processes may be employed to thin semiconducting material layer down to the range used in the first embodiment of the present invention.

Figure 17:
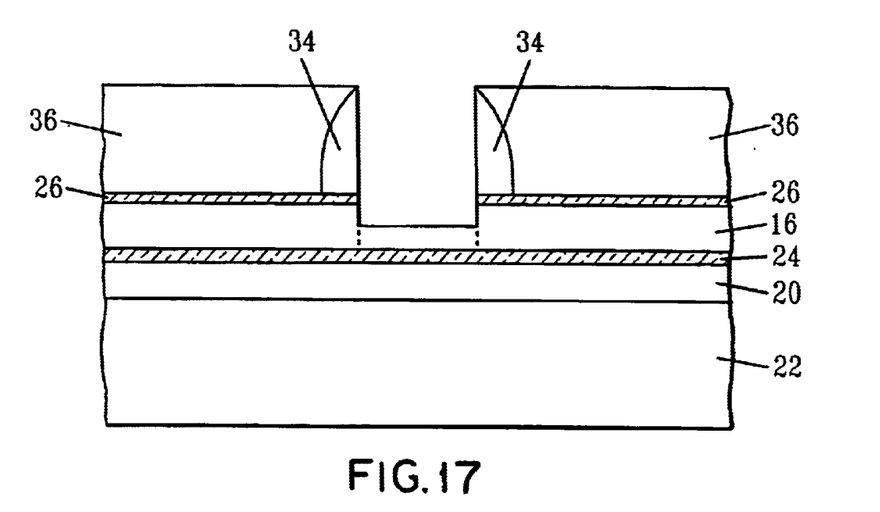

Alternatively, the repeated oxidation and chemical oxide removal steps may be performed after forming the device channel region and the backside gate region of the device. Notwithstanding which is employed, the oxidation step includes conventional conditions well known an in the art and the chemical oxide removal (COR) process is a vapor phase chemical oxide removal process wherein a vapor of HF and NH₃ is employed as the etchant and low pressures (6 millitorr or less) are used. Although these repeated processes remove the exposed pad oxide layer in the opening, they also remove a portion of the thick semiconducting material layer to a thickness of about 200 Å or less. The resultant structure is shown in FIG. 17; note thinning occurs prior to implanting. Alternatively, the repeated oxidation and COR processes may proceed the formation of implant region 42.

Figure 18:
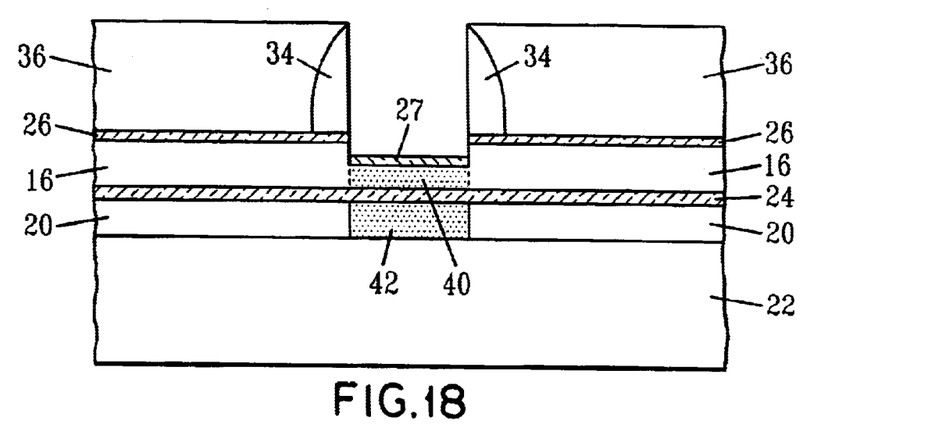
Figure 19:
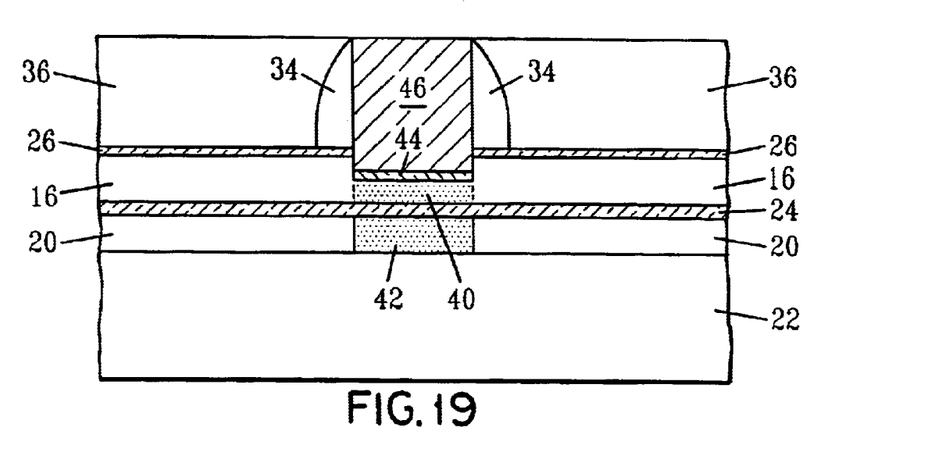
Figure 20:
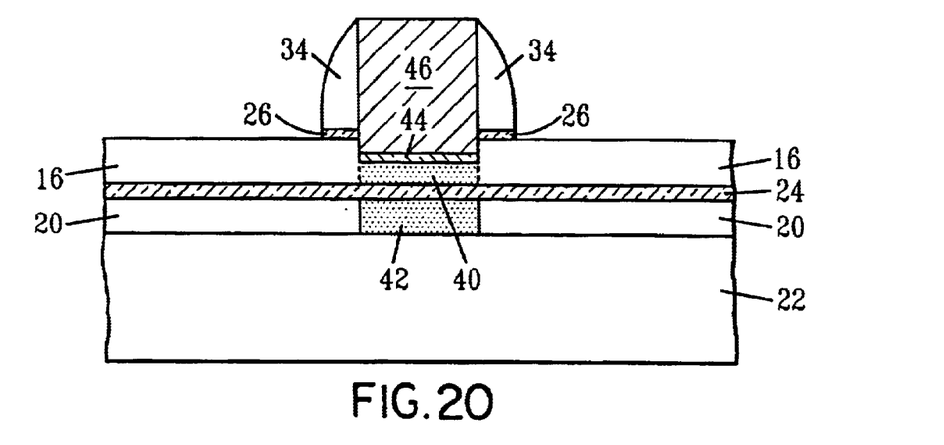

The remaining processing steps used in the second embodiment of the present invention, as illustrated by FIGS. 18–20, are identical to the processing steps used above; therefore no further details are needed concerning the same here. It is however noted that a thin sacrificial oxide layer 27 may be formed on the thinning semiconducting material layer prior to formation of implant regions 40 or 42. The thin sacrificial oxide layer is removed and is replaced with gate dielectric 44.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope and spirit of the present invention.

Having thus described our invention in detail, what we claim as new and desire to secure by the Letters Patent is:

1. A sub-0.05 μm double-gated MOSFET device comprising:

a substrate which includes a source region and a drain region abutting a sub-0.05 μm doped channel region, said source and drain regions do not extend beyond a lower surface of the channel region, said channel region is located in a portion of a semiconducting material layer of a silicon-on-insulator wafer, and said semiconducting layer having a thickness of less than about 200 Å and is sandwiched between two gate dielectrics;

an implanted doped backside gate electrode formed beneath said channel region; and a polysilicon frontside gate electrode formed over said channel region, said implanted-doped backside gate electrode, said channel region and said polysilicon frontside gate electrode are self-aligned to each other and to the source and drain regions.

2. The sub-0.05 μm double-gated MOSFET device of claim 1 wherein said substrate includes P⁺ base layer, a P⁻ epi layer formed on said P⁺ base layer, one of said gate dielectrics formed on said P⁻ epi layer and said semiconducting material formed on a diffusion barrier layer.

3. The sub-0.05 µm µdouble-gated MOSFET device of claim 1 further comprising raised source and drain regions formed adjacent to said polysilicon frontside gate electrode.

4. The sub-0.05 µm double-gated MOSFET device of claim 1 wherein spacers are present on exposed sidewalls of said polysilicon frontside gate electrode.

* * * * *

UNITED STATES PATENT AND TRADEMARK OFFICE
CERTIFICATE OF CORRECTION

PATENT NO. : 6,686,630 B2
DATED : February 3, 2004
INVENTOR(S) : Hussein I. Hanafi et al.

It is certified that error appears in the above-identified patent and that said Letters Patent is hereby corrected as shown below:

Column 3,
Line 60, "grater" should read -- greater --

Column 9,
Line 3, "$\mu$double" should read -- double --

Signed and Sealed this

Twenty-ninth Day of June, 2004

JON W. DUDAS
*Acting Director of the United States Patent and Trademark Office*